(12) United States Patent
Ahn et al.

(10) Patent No.: US 10,797,625 B2
(45) Date of Patent: Oct. 6, 2020

(54) DETECTION DEVICE AND DETECTION METHOD FOR DETECTING NUMBER OF REVOLUTIONS OF SENSORLESS EPB MOTOR

(71) Applicant: ERAE AMS CO., LTD., Daegu (KR)

(72) Inventors: Dae Ki Ahn, Daegu (KR); Seung Soo Noh, Daegu (KR); Shin Deok Kang, Daegu (KR); Eung Soo Kim, Daegu (KR); Soo Hwan Song, Daegu (KR)

(73) Assignee: ERAE AMS CO., LTD., Daegu (KR)

( * ) Notice: Subject to any disclaimer, the term of this patent is extended or adjusted under 35 U.S.C. 154(b) by 151 days.

(21) Appl. No.: 16/077,506

(22) PCT Filed: Feb. 15, 2017

(86) PCT No.: PCT/KR2017/001640
§ 371 (c)(1),
(2) Date: Aug. 13, 2018

(87) PCT Pub. No.: WO2017/142300
PCT Pub. Date: Aug. 24, 2017

(65) Prior Publication Data
US 2019/0052202 A1   Feb. 14, 2019

(30) Foreign Application Priority Data
Feb. 18, 2016 (KR) .................. 10-2016-0019364

(51) Int. Cl.
*H02P 6/17* (2016.01)
*B60T 17/22* (2006.01)
(Continued)

(52) U.S. Cl.
CPC .............. *H02P 6/17* (2016.02); *B60R 16/033* (2013.01); *B60T 13/74* (2013.01); *B60T 17/221* (2013.01);
(Continued)

(58) Field of Classification Search
CPC .......... H02P 6/17; H02P 6/18; H02P 2203/09; H02P 7/0094; H02P 29/024;
(Continued)

(56) References Cited

U.S. PATENT DOCUMENTS 4,138,630 A * 2/1979 Graham ............... H02H 7/0851
318/257
6,144,179 A * 11/2000 Kessler ..................... G01P 3/48
318/135
(Continued)

FOREIGN PATENT DOCUMENTS

DE   10 2008 022621 A1   11/2009
JP   2004-080921 A   3/2004
(Continued)

OTHER PUBLICATIONS

English machine translation of Son KR 101315782 (Year: 2015).*
(Continued)

*Primary Examiner* — Lee E Rodak
(74) *Attorney, Agent, or Firm* — LRK Patent Law Firm

(57) ABSTRACT

A device and method for detecting the number of revolutions of a sensorless electric park brake (EPB) motor. The device for detecting the number of revolutions of a sensorless motor includes: an actuator driving motor used to set and release a parking brake of an EPB system; an electronic control module for controlling the motor, a vehicle battery for supplying power to the motor and the electronic control module; and a main processing unit for receiving an output signal of the electronic control module and estimating the number of revolutions of the motor, wherein the electronic control module further includes a ripple measuring unit for receiving an output signal of the motor and measuring a ripple of the motor.

15 Claims, 6 Drawing Sheets

(51) Int. Cl.
*G01P 3/46* (2006.01)
*H02P 6/18* (2016.01)
*B60R 16/033* (2006.01)
*G01R 23/165* (2006.01)
*G01R 31/34* (2020.01)
*G01R 19/165* (2006.01)
*B60T 13/74* (2006.01)

(52) U.S. Cl.
CPC ............ *G01P 3/46* (2013.01); *G01R 19/165* (2013.01); *G01R 23/165* (2013.01); *G01R 31/34* (2013.01); *H02P 6/18* (2013.01); *B60T 13/746* (2013.01); *H02P 2203/09* (2013.01)

(58) Field of Classification Search
CPC ............ H02P 29/0241; H02P 7/2805; H02P 2205/00; B60T 13/74; B60T 13/746; B60T 17/18; B60T 7/042; B60T 8/17; B60T 11/04; B60T 13/66; B60T 13/662; B60T 13/686; B60T 13/741; B60T 17/22; B60T 7/10; B60T 8/171; B60T 8/172; B60T 8/88; B60T 13/146; B60T 13/58; B60T 13/586; B60T 13/588; B60T 13/745; B60T 17/221; B60T 17/223; B60T 1/10; B60T 2270/40; B60T 2270/402; B60T 2270/413; B60T 2270/604; B60T 7/085; B60T 7/105; B60T 7/107; B60T 8/175; B60T 8/404; B60T 8/405; B60T 8/4059; B60T 8/885; G01R 19/165; G01R 31/34; G01R 23/165; B60R 16/033; G01P 3/46
See application file for complete search history.

(56) References Cited

U.S. PATENT DOCUMENTS

| 2008/0004832 | A1* | 1/2008 | Linden | H02P 7/2805 |
| | | | | 702/150 |
| 2008/0298784 | A1* | 12/2008 | Kastner | G01P 3/48 |
| | | | | 388/811 |
| 2013/0026817 | A1* | 1/2013 | Morishita | B60T 1/10 |
| | | | | 303/3 |
| 2013/0043820 | A1* | 2/2013 | Knezevic | H02P 7/0094 |
| | | | | 318/603 |
| 2014/0214269 | A1* | 7/2014 | Knechtges | B60T 13/588 |
| | | | | 701/34.4 |

FOREIGN PATENT DOCUMENTS

| JP | 2014-064424 A | 4/2014 |
| JP | 2014-108743 A | 6/2014 |
| KR | 10-2010-0108013 A | 10/2010 |
| KR | 10-2013-0111338 A | 10/2013 |
| KR | 101315782 B1 * | 10/2013 |

OTHER PUBLICATIONS

Search Report, dated Apr. 28, 2017, for International Application No. PCT/KR2017/001640.

Written Opinion, dated Apr. 28, 2017, for International Application No. PCT/KR2017/001640.

European Search Report dated Sep. 9, 2019 in connection with European Patent Application No. 17753461 which correspond to the above-referenced U.S. application.

Young Ok Lee et al., "Novel clamoing force contol for electric parking brake systems", Mechatronics 21 (2011) 1156-1162.

* cited by examiner

DETECTION DEVICE AND DETECTION METHOD FOR DETECTING NUMBER OF REVOLUTIONS OF SENSORLESS EPB MOTOR

CROSS-REFERENCE TO RELATED APPLICATIONS

The present application is a U.S. National Phase entry from International Application No. PCT/KR2017/001640, filed Feb. 15, 2017, which claims priority to Korean Patent Application No. 10-2016-0019364, filed Feb. 18, 2016, the disclosure of which is incorporated by reference herein in its entirety.

BACKGROUND

1. Technical Field

The present invention relates to a technique for an electronic parking brake (EPB) and, more particularly, to a detection device and a detection method for detecting the number of revolutions of a sensorless EPB motor other than a conventional EPB motor equipped with a built-in sensor.

2. Description of Related Art

In a typical EPB application, a separate actuator equipped with a motor is used to restrict movement of a wheel. A caliper type or a cable puller type EPB is mainly used as means for restricting the movement of the wheel. For example, in order to control the position of the caliper and provide an appropriate braking force to the wheel, a magnet is generally disposed inside the actuator and a linear Hall sensor is equipped to measure a change in magnetic field from the magnet. The parking brake tension generated in the actuator by driving the motor can be detected through the linear Hall sensor.

FIG. 1 and FIG. 2 are conceptual diagrams showing an example of an EPB assembly. FIG. 3 is a view showing a device for detecting the number of revolutions of the motor according to the driving of an actuator of an EPB assembly according to the conventional art.

Herein, the EPB assembly 1 may include, for example, a housing 10, a gear box (not shown), an actuator 20, a motor 30, an EPB electronic control module 40, and the like. In particular, the actuator shown in FIGS. 1 to 3 is a cable puller type actuator, and has a spring 22 and a thread 21 formed on a gear train and an actuator rotating shaft respectively, as one embodiment.

The parking brake tension detection system of the conventional art shown in FIG. 3 additionally includes a magnet 41 and a linear Hall sensor assembly 42 for sensing the number of revolutions of an actuator or a motor. The material cost increases due to the addition of the magnet 41 and the linear Hall sensor assembly 42, and a magnetic body of the magnet 41 must have an optimized design to sensitively sense a change in the magnetic field, which results in increasing the burden on the design.

In addition, if the magnetism is lost due to the characteristics of the magnet, the magnet cannot play the role of the sensor itself which results in a phenomenon called brake drag, whereby there is a problem that accurate position control becomes impossible.

In addition, according to the conventional EPB caliper position control device, there is also a risk that the driving of the motor or the actuator is not performed due to a subtle positional fluctuation caused by continuous use of the EPB, overheating of the motor, a sticking phenomenon due to foreign matter penetration into the actuator or abrasion phenomenon, and the like.

SUMMARY

Accordingly, the present invention has been made keeping in mind the above problems occurring in the conventional art, and an object of the present invention is to provide a detection device and a detection method for detecting the number of revolutions of a motor that controls an operation of an EPB actuator without providing a magnet and Hall sensor separately.

When the EPB motor rotates, a ripple signal generated due to an electrical repulsive force between a rotor and a stator in the motor is used to detect the number of revolutions of the motor.

Ultimately, a method of controlling precise position of the EPB is proposed.

According to an embodiment of the present invention, a detection device for detecting a number of revolutions of a sensorless motor for an electronic parking brake (EPB) is provided, the device including: an actuator driving motor used to set and release a parking brake of an EPB system; an electronic control module for controlling the motor, a vehicle battery for supplying power to the motor and the electronic control module; and a main processing unit for receiving an output signal of the electronic control module and estimating the number of revolutions of the motor, wherein the electronic control module further comprises a ripple measuring unit for receiving an output signal of the motor and measuring a ripple of the motor.

According to an embodiment, the output signal of the motor corresponds to either a current or a voltage.

Herein, the output signal of the motor is output as a value adjusted using a signal amplifier or a signal attenuator.

In addition, the ripple measuring unit further includes: a ripple signal selector for selecting only a ripple signal from the output signal of the motor, a first level translator for receiving a ripple signal selected by the ripple signal selector and a direct current signal of the battery and translating an electric potential thereof; and a second level translator for receiving the direct current signal of the battery and translating an electric potential thereof.

According to an embodiment, the ripple measuring unit further includes a comparator for comparing an output of the first level translator and an output of the second level translator to output a signal obtained when the ripple signal changes.

According to an embodiment, the ripple measuring unit further includes an offset controller for controlling operation sensitivity of the ripple signal.

Herein, the offset controller is connected backwards to the first level translator.

According to an embodiment, the ripple measuring unit further includes a low-pass filter for removing a high frequency noise of a signal output from the comparator.

In addition, the electronic control module includes the ripple measuring unit is configured as a form of an Application Specific Integrated Circuit (ASIC).

According to another embodiment of the present invention, a method of detecting a number of revolutions of a sensorless motor for an EPB is provided, the method including: (a) selecting only a ripple signal from an output signal of a motor, (b) combining the selected ripple signal and a direct current signal of a vehicle battery, (c) comparing a signal combined in the step (b) and the direct current signal of the vehicle battery to output a signal obtained when the ripple signal changes; (d) applying the signal output in the step (c) to a main processing unit; and (e) estimating the number of revolutions of the motor using the signal applied to the main processing unit.

Herein, the method further includes: controlling an offset after the step (b).

In addition, the method further includes: filtering step of removing a high frequency noise after the step (c).

Advantageous Effects

According to an embodiment of the present invention, it is possible to sense the number of revolutions of the EPB motor without providing the magnet or the linear Hall sensor with respect to use of the EPB motor.

According to the present invention, since the number of revolutions of the EPB motor may be precisely sensed, there is an advantage that precise position control of the EPB system is enabled.

In addition, since the magnet and the linear Hall sensor are not provided, the weight of the EPB actuator can be reduced and the volume thereof can be reduced. Thus, the actuator can be easily designed and the cost of the product can be lowered.

DETAILED DESCRIPTION OF THE INVENTION

Figure 1:
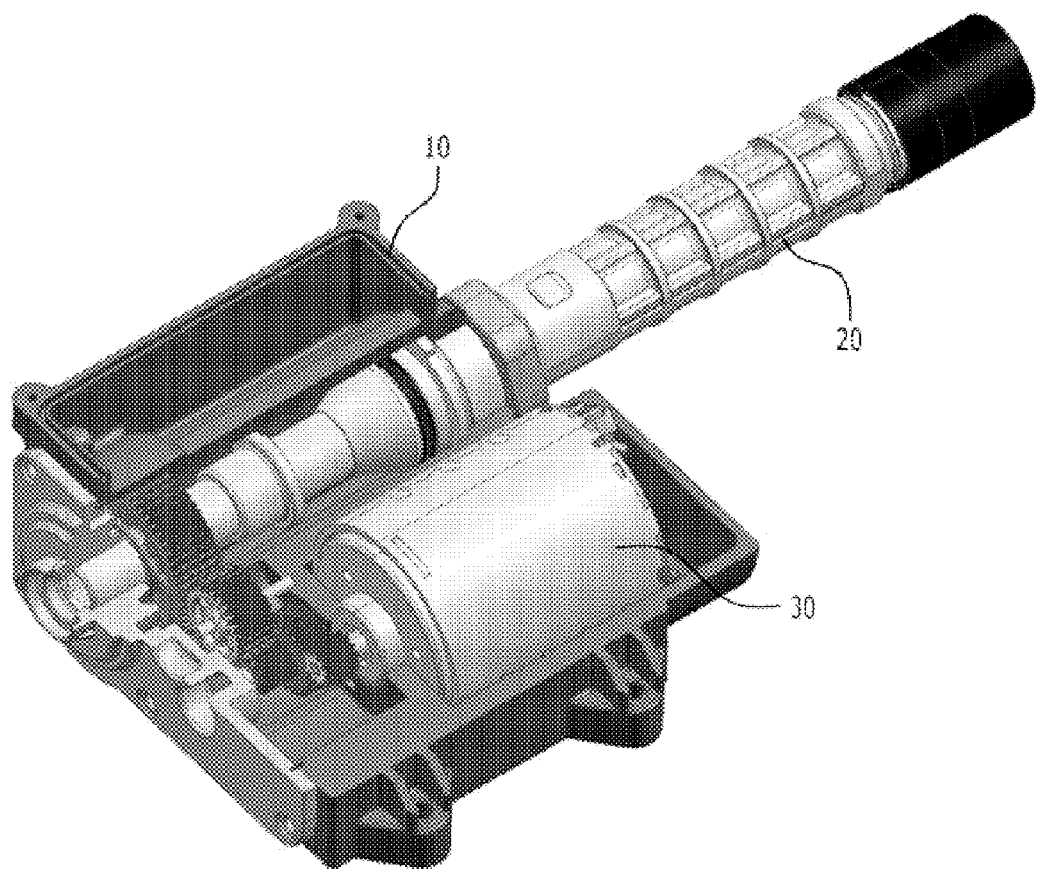
FIGS. 1 and 2 are views illustrating an EPB assembly according to one embodiment.
Figure 2:
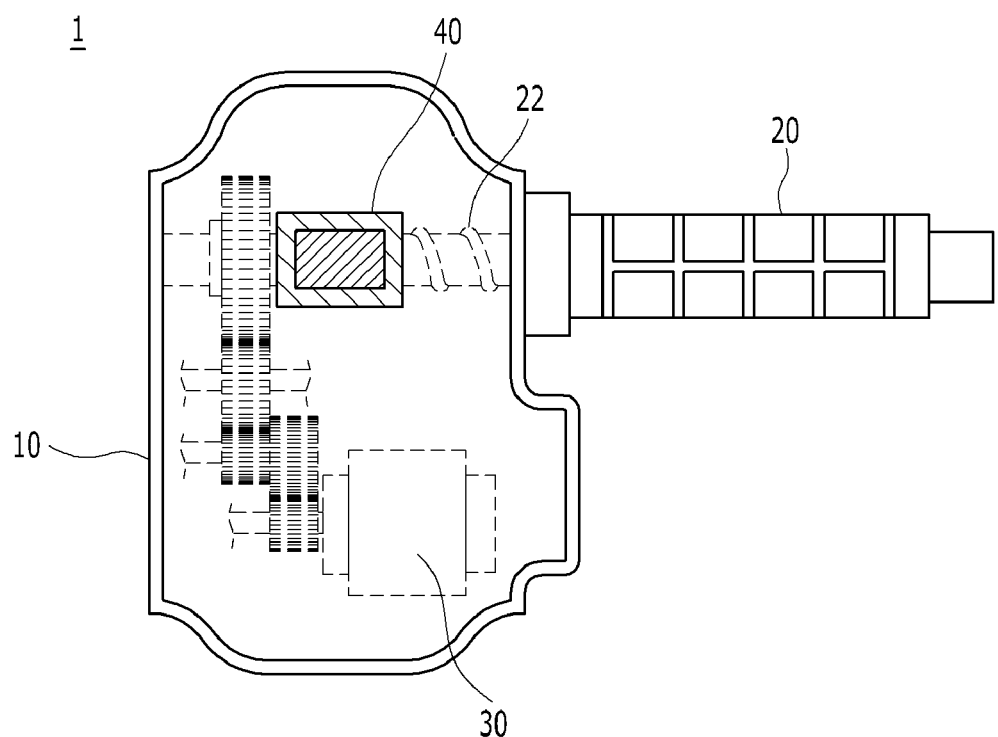
Figure 3:
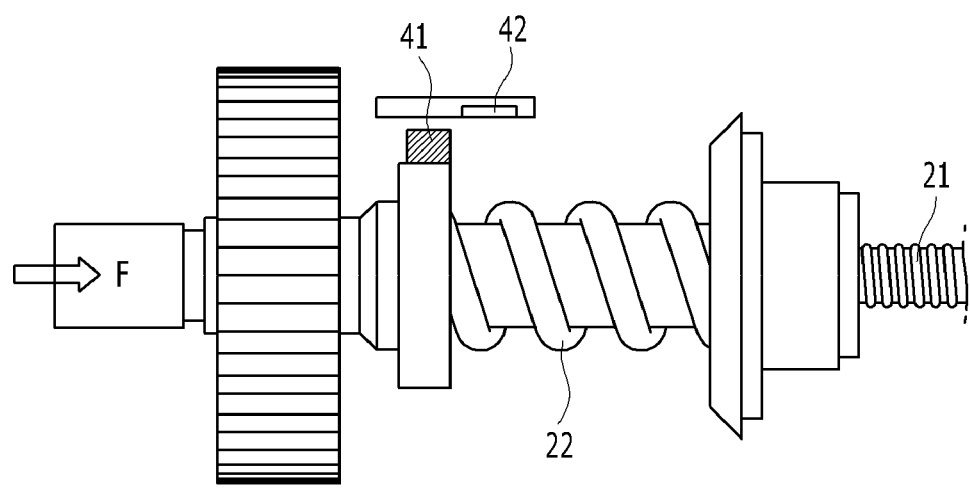
FIG. 3 is a view showing a device for detecting the number of revolutions of the motor according to the driving of an actuator of an EPB assembly according to the conventional art.

The embodiments described below are provided so that those skilled in the art can easily understand the technical idea of the present invention, and thus the present invention is not limited thereto. In addition, the matters described in the attached drawings may be different from those actually implemented by schematized drawings to easily describe embodiments of the present invention.

It is to be understood that when an element is referred to as being connected or connected to another element, it may be directly connected or connected to the other element, and other elements may be also present in between.

The term "connection" as used herein means a direct connection or an indirect connection between a member and another member, and may refer to all physical connections such as adhesion, attachment, fastening, bonding, and coupling.

Also, the expressions such as "first", "second", etc. are used only to distinguish between plural configurations, and do not limit the order or other specifications between configurations.

The singular forms include plural forms unless the context clearly dictates otherwise. It is to be understood that the words "comprising" or "having", etc. mean that features, numbers, steps, operations, elements, parts, or combinations thereof are present, and one or more features or numbers, steps, operations, elements, parts, or combinations thereof may be added.

Prior to the description of the drawings, the same constituent elements as in the conventional art will be described using the same reference numerals.

A detection device for detecting the number of revolutions of a sensorless motor for an electronic parking brake (EPB) according to an embodiment of the present invention includes an actuator driving motor 30 used to set and release a parking brake of an EPB system; an electronic control module 40 for controlling the motor 30; a vehicle battery 50 for supplying power to the motor 30 and the electronic control module 40; and a main processing unit 200 for receiving an output signal of the electronic control module 40 and estimating the number of revolutions of the motor 30.

Herein, the present invention is characterized in that the electronic control module 40 further includes a ripple measuring unit 100 for receiving the output signal of the motor 30 and measuring (or detecting) a ripple of the motor 30.

The motor 30 in the present invention is a sensorless motor that does not include a magnet, a Hall sensor, etc.

Here, an output signal of the motor 30 may correspond to either a current or a voltage. That is, the ripple of the motor 30 measured by the ripple measuring unit 100 of the present invention may be a ripple component of the driving current or a ripple component of the driving voltage.

Figure 4:
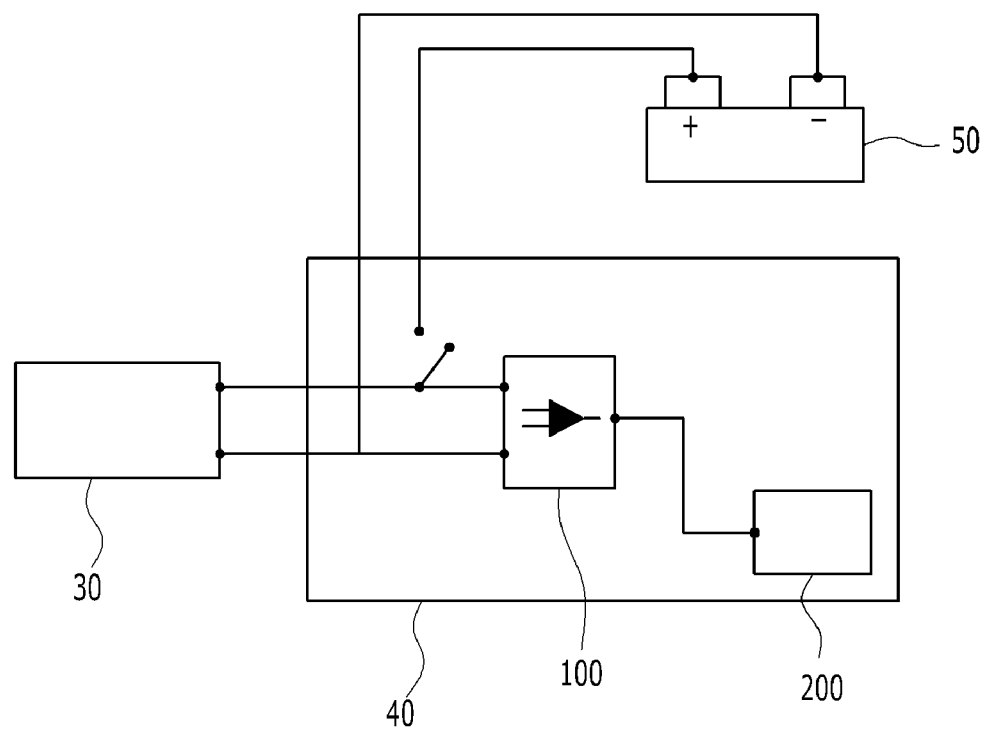
FIG. 4 is a schematic view of a device for detecting the number of revolutions of a motor for an EPB according to an embodiment of the present invention.

FIG. 4 is a schematic view of a device for detecting the number of revolutions of a sensorless motor for EPB according to the present invention. Referring to FIG. 4, the motor 30, the electronic control module 40, and the vehicle battery 50 may be electrically connected to each other. The motor 30 is driven by receiving power from the vehicle battery, to detect the ripple component of the output signal of the motor 30 and thus to precisely estimate the number of revolutions of the motor 30. Further, when the number of revolutions of the motor 30 is estimated, the brake tension may be estimated and thus the precise operation of the EPB assembly is enabled.

Meanwhile, the output signal of the motor according to an exemplary embodiment of the present invention may be output as a value adjusted using a signal amplifier and a signal attenuator.

Figure 5:
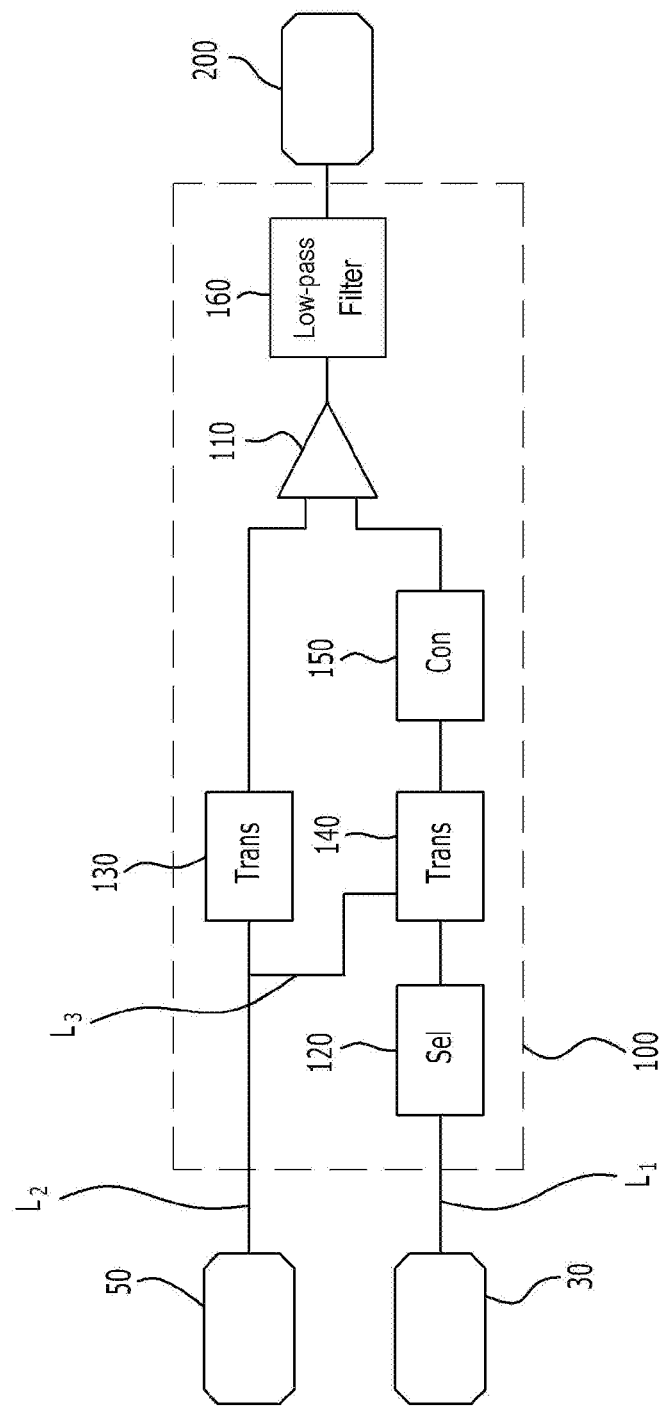
FIG. 5 is a diagram showing an operation flow of a device for detecting the number of revolutions of a sensorless motor for an EPB of the present invention.

FIG. 5 is a diagram showing an operational flow of a detection device for detecting the number of revolutions of a sensorless motor for an EPB of the present invention.

The ripple measuring unit 100 of the present invention may further include a ripple signal selector 120 for selecting only a ripple signal from an output signal of the motor, a first level translator 140 for receiving a ripple signal selected by the ripple signal selector 120 and a direct current signal of the vehicle battery 50 and translating an electric potential thereof, and a second level translator 130 for receiving a direct current signal of the vehicle battery 50 and translate an electric potential thereof, as shown in FIG. 5. Here, the first level translator 140 may be connected to the operation flow line L3 to receive the direct current signal of the battery 50, and may be connected to the operation flow line L1 to receive the selected ripple signal. The second level translator 130 may be connected to the operation flow line L2 to receive the direct current signal of the battery 50.

Due to structural characteristics of the motor 30, a specific ripple is present in an output waveform of the motor 30, and only such a ripple signal is extracted through the ripple signal selector 120 included in the ripple measuring unit 100. Herein, the structural characteristics of the motor may mean characteristics caused due to electrical repulsive force between the rotor and the stator as described above.

The ripple signal selector 120 may be, for example, a true RMS to DC converter. The true RMS to DC converter is a circuit element having a transformer or a probe embedded therein, and may be a signal extraction converter that converts waveforms of all types into effective values without regard to direct current, alternating current, irregular alternating current, and the like. At least one OP-AMP is provided and connected to the true RMS to DC Converter, thereby making it possible to extract pure ripple voltage waveform.

Then, the first level translator 140 receives the direct current signal of the battery 50 together with the selected ripple signal to translate the electric potential thereof. This is to detect the number of revolutions of the motor and thus eliminate various noises or disturbances, by combining the ripple signal that is irregular and the direct current signal that has substantially constant electric potential.

As shown in FIG. 5, the second level translator 130 receives only the DC signal of the battery 50. The second level translator 130 is configured to provide a comparison value with the electric potential translated by the first level translator 140 through a comparator 110 described later and detect a precise number of revolutions of the motor. The direct current signal at the second level translator 130 and the direct current signal to be combined at the first level translator 140 may have substantially the same electric potential, and in addition the DC signal at the second level translator 130 and the DC signal to be combined at the first level translator 140 may have substantially the same phase.

The first level translator 140 and the second level translator 130 may be configured, for example, by combining a digital pulse converter and other circuit elements, and may convert a sine wave voltage or current waveform into a square wave output.

The ripple measuring unit 100 in the detection device for detecting the number of revolutions of the sensorless motor for the EPB according to an embodiment of the present invention may include a comparator 110 that compares the output of the first level translator 140 and the output of the second level translator 130 and outputs a signal obtained when the ripple changes.

The first level translator 140 outputs an electric potential of a signal obtained by causing the ripple signal and the direct current signal to be combined and translated, and the output of the second level translator 130 outputs only an electric potential of the direct current signal. Accordingly, unlike the output of the second level translator 130, the output of the first level translator 140 contains unique characteristics related to the rotation of the motor. The comparator 110 compares the electric potential of the first level translator 140 and the electric potential of the second level translator 130 to sense a change in the ripple and thus estimates the number of revolutions of the motor. Herein, the output from the comparator 110 may be converted into a form of high/low square wave or pulse wave.

Further, the ripple measuring unit 100 according to an embodiment of the present invention may further include a low-pass filter 160 for removing a high frequency noise of a signal output from the comparator 110.

Meanwhile, the ripple measuring unit 100 according to an embodiment of the present invention may further include an offset controller 150 for controlling the operation sensitivity of the ripple signal. The offset controller 150 may be connected backwards to a first level translator 140.

Before comparison with the electric potential of the second level translator 130 in the comparator 110, when the ripple voltage or ripple current signal is not suitable for input into the comparator 110, the offset controller 150 takes a role of making lower or higher the sensitivity of the ripple voltage and ripple current signal in advance. For example, the output waveform of the comparator 110 is removed when there is no motor ripple (that is, when the motor does not rotate), so that the control is performed in such a manner that an output waveform of the comparator 110 may be generated only when there is always a change in the motor ripple current (that is, when the motor rotates). Preferably, the ripple voltage or ripple current signal through the offset controller 150 uses a signal when the EPB motor is operating.

Herein, whether or not an input to the comparator 110 is suitable may be determined through comparison with a reference value. In addition, the offset controller 150 may be provided such that the reference value may be variably set to correspond to characteristics that the ripple current and voltage depend on a type of the motor.

Meanwhile, the electronic control module 40 including the ripple measuring unit 100 may be configured with a form of an Application Specific Integrated Circuit (ASIC). A shape and size of the electronic control module 40 and the arrangement of the components are not limited to those shown in the drawings and may be variously modified.

The electronic control module 40 of the present invention functions as a microcontroller in the EPB, and counts the number of pulses of the ripple, thereby allowing the number of revolutions of the EPB motor to be precisely measured. In this process, the voltage or current type ripple may be converted into a value or a parameter that the electronic control module 40 may recognize.

The electronic control module 40 issues a driving command to the EPB actuator based on the measured number of revolutions of the EPB motor, whereby precise position control of the EPB is enabled.

Finally, referring to FIG. 6, a method of detecting the number of revolutions of the sensorless motor for the EPB according to an embodiment of the present invention will be described.

Figure 6:
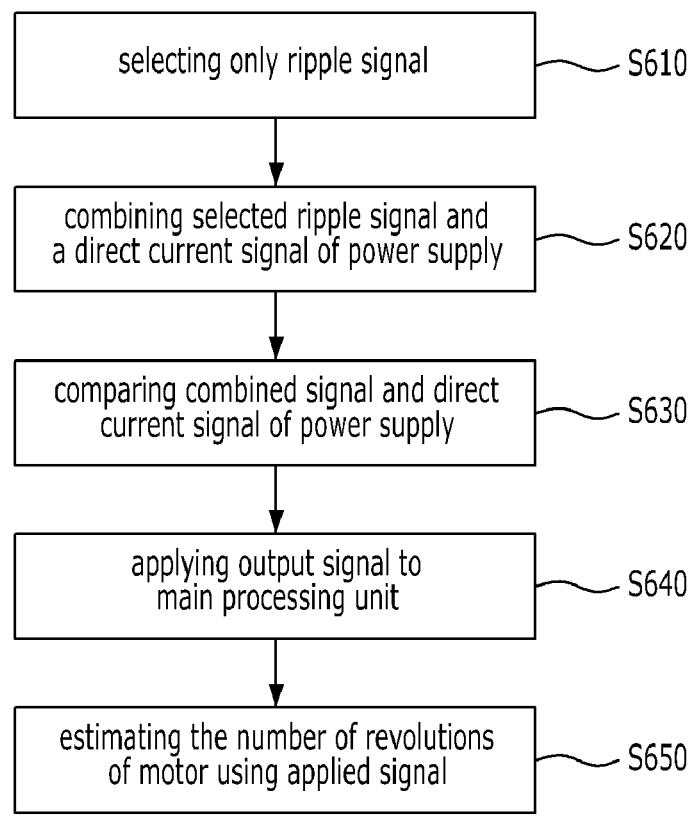
FIG. 6 is a block diagram showing a method of detecting the number of revolutions of a sensorless motor for an EPB of the present invention.

FIG. 6 is a block diagram illustrating a detection method of detecting the number of revolutions of a sensorless motor for an EPB of the present invention.

A method of detecting the number of revolutions of a motor according to an embodiment of the present invention includes: (a) selecting only a ripple signal from an output signal of the motor (S610), (b) combining the selected ripple signal and a direct current signal of a vehicle battery (S620); (c) comparing the signal combined in the step (b) and the direct current signal of the vehicle battery to output a signal obtained when the ripple signal changes (S630); (d) applying the signal output in the step (c) to the main processing unit (S640); and (e) estimating the number of revolutions of the motor using the signal applied to the main processing unit (S650).

If the number of ripples is detected in the ripple signal applied by the main processing unit 200, the detected ripple is a value reflecting information on structures unique to the motor such as a rotor, a stator, a flange, an air cap, case, and the like, and thus the number of revolutions of the motor may be estimated using the ripple.

While the flowcharts depict operations in the drawings in a particular order, they are shown for the sake of obtaining the most desirable results and should not be construed as necessarily enforcing such operations in the particular order or sequential order shown. That is, the steps disclosed in S610 to S650 may be practiced in such a manner to be freely substituted by those skilled in the art without departing from the scope of the invention.

The method may further include a step of controlling an offset after the step (b), and may further include a filtering step of removing a high frequency noise after the step (c).

Since the method of detecting the number of revolutions of the motor may be performed using the device for detecting the number of revolutions of the sensorless motor described above so that both are essentially the same, description on the method will be omitted.

The specification is not intended to limit the invention to the precise form disclosed. While the present invention has been described in connection with what is presently considered to be practical exemplary embodiments, it is to be understood that the invention is not limited to the disclosed embodiments, but on the contrary, changes and modifications can be made.

The scope of the present invention is defined by the appended claims rather than the detailed description, and all changes or modifications derived from the meaning and range of the claims and their equivalents should be interpreted as being included in the scope of the present invention.

INDUSTRIAL APPLICABILITY

According to an embodiment of the present invention described above, when the EPB motor is used, the number of revolutions can be precisely detected using only the ripple of the EPB motor, and precise position control of the EPB system is enabled based on the number of revolutions. Accordingly, the magnet or the linear Hall sensor for measuring the number of revolutions are not necessary unlike the conventional EPB motor, whereby it is possible to reduce the volume of the entire EPB and reduce the manufacturing cost.

The invention claimed is:

1. A device for detecting a number of revolutions of a sensorless motor for an electronic parking brake (EPB), the device comprising:
    an actuator driving motor used to set and release a parking brake of an EPB system;
    an electronic control module for controlling the motor;
    a vehicle battery for supplying power to the motor and the electronic control module; and
    a main processing unit for receiving an output signal of the electronic control module and estimating the number of revolutions of the motor,
    wherein an output signal of the motor corresponds to either a current or a voltage,
    wherein the electronic control module further comprises a ripple measuring unit for receiving the output signal of the motor and measuring a ripple of the motor, and
    wherein the ripple measuring unit includes:
    a ripple signal selector for selecting only a ripple signal from the output signal of the motor;
    a first level translator for receiving both the ripple signal selected by the ripple signal selector and a direct current signal of the battery and translating and combining the ripple signal and the direct current signal; and
    a second level translator for receiving and translating the direct current signal of the battery.

2. The device according to claim 1, wherein the output signal of the motor is output as a value adjusted using a signal amplifier or a signal attenuator.

3. The device according to claim 2, wherein the electronic control module including the ripple measuring unit is configured as a form of an Application Specific Integrated Circuit (ASIC).

4. The device according to claim 1, wherein the ripple measuring unit further includes a comparator for comparing an output of the first level translator and an output of the second level translator to output a signal obtained when the ripple signal changes.

5. The device according to claim 4, wherein the ripple measuring unit further includes an offset controller for controlling operation sensitivity of the ripple signal.

6. The device according to claim 5, wherein the offset controller is connected between the first level translator and the comparator.

7. The device according to claim 6, wherein the electronic control module including the ripple measuring unit is configured as a form of an Application Specific Integrated Circuit (ASIC).

8. The device according to claim 5, wherein the electronic control module including the ripple measuring unit is configured as a form of an Application Specific Integrated Circuit (ASIC).

9. The device according to claim 4, wherein the electronic control module including the ripple measuring unit is configured as a form of an Application Specific Integrated Circuit (ASIC).

10. The device according to claim 1, wherein the ripple measuring unit further includes a low-pass filter for removing a high frequency noise of a signal output from a comparator.

11. The device according to claim 10, wherein the electronic control module including the ripple measuring unit is configured as a form of an Application Specific Integrated Circuit (ASIC).

12. The device according to claim 1, wherein the electronic control module including the ripple measuring unit is configured as a form of an Application Specific Integrated Circuit (ASIC).

13. A method of detecting a number of revolutions of a sensorless motor for an electronic parking brake (EPB), the method comprising:
    (a) selecting only a ripple signal from an output signal of a motor;
    (b) combining the selected ripple signal and a direct current signal of a vehicle battery;
    (c) comparing a signal combined in the step (b) and the direct current signal of the vehicle battery to output a signal obtained when the ripple signal changes;
    (d) applying the signal output in the step (c) to a main processing unit; and
    (e) estimating the number of revolutions of the motor using the signal applied to the main processing unit.

14. The method according to claim 13, further comprising:
    controlling an offset after the step (b).

15. The method according to claim 13, further comprising:
    filtering step of removing a high frequency noise after the step (c).

* * * * *